United States Patent
Wang et al.

(10) Patent No.: US 6,478,600 B1
(45) Date of Patent: Nov. 12, 2002

(54) SMT CONTACT FOR A ZIF SOCKET

(75) Inventors: Jwomin Wang, Hsin-Dan (TW); Genn-Sheng Lee, Tu-Chen (TW); Yao-Chi Huang, Tu-Chen (TW); Yi-Feng Lo, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/036,283

(22) Filed: Dec. 24, 2001

(51) Int. Cl.[7] .................................................. H01R 4/48
(52) U.S. Cl. ........................................ 439/342; 439/862
(58) Field of Search ................................ 439/862, 342, 439/259

(56) References Cited

U.S. PATENT DOCUMENTS 6,086,401 A * 7/2000 Hsiung et al. .............. 439/342
6,152,757 A * 11/2000 Szu .............................. 439/342
6,186,815 B1 * 2/2001 Lin .............................. 439/342
6,186,816 B1 * 2/2001 Lu et al. ...................... 439/342
6,210,196 B1 * 4/2001 Wang et al. ................. 439/342
6,210,198 B1 * 4/2001 McHugh et al. ............ 439/342
6,315,621 B1 * 11/2001 Natori et al. ............... 439/862

* cited by examiner

Primary Examiner—Gary Paumen
(74) Attorney, Agent, or Firm—Wei Te Chung

(57) ABSTRACT

A ZIF socket (1) for receiving pins (6) of a CPU includes a dielectric base (3), a cover (4) movably mounted on the dielectric base, and a plurality of contacts (2) received in the base. Each contact comprises a soldering section (20), a retaining section (21) secured within a passageway (30) of the base, a connecting section (23), and a contacting section (22) for electrically connecting with the pin. An L-shaped portion (25) is formed by the contacting section and the connecting section. A guiding section (24) extends along an inner edge of the L-shaped portion and is coined in a blade-shape.

1 Claim, 7 Drawing Sheets

SMT CONTACT FOR A ZIF SOCKET

BACKGROUND OF THE INVENTION

1. Field of the Invention

The present invention relates to a surface-mounted contact of a socket, and particularly to a surface-mounted contact of a Zero Insertion Force (ZIF) socket, which has a guiding section formed thereon.

2. Description of Prior Art

Surface-mounted contacts are widely used in a ZIF socket to electrically connect pins of a Central Processing Unit (CPU) to traces on a printed circuit board. Referring to FIGS. 7 and 8, as disclosed in Taiwan Patent Application No. 88206561, a conventional ZIF socket using such kind of contact commonly comprises a dielectric base 9 receiving a plurality of surface-mounted contacts 8, and a cover 7 slidably mounted on the dielectric base 9. Each surface-mounted contact 8 has a soldering section 82, a retaining section 83 retaining the contact in a corresponding passageway 90 of the dielectric base 9, a connecting section 84 and a contacting section 81. After inserting the pins of the CPU into corresponding holes 70 of the cover 7 and corresponding passageway 90 of the base 9, each pin moves in the passageway 90 and contacts the contacting section 81 of the corresponding contact 8 along a bottom line 811 of the contacting section 81 upon a pushing force exerted thereon. However, with the increased number of the pins of the CPU, an increased pushing force is required to push the pins of the CPU into contact with the contacts 8 of the ZIF socket. Moreover, free ends of the pins are easy to be blocked in a corner 85 between the contacting section 81 and the connecting section 84 during pushing operation of the cover 7, which may also result in an increased pushing force.

Hence, an improved surface-mounted contact is required to overcome the disadvantages of the prior art.

BRIEF SUMMARY OF THE INVENTION

The primary object of the present invention is to provide a surface-mounted contact of a ZIF socket which receives a CPU thereon, the surface-mounted contact having a guiding section for decreasing the pushing force exerted on pins of the CPU with respect to a ZIF socket having a high contact density.

In order to achieve the above-mentioned object, a surface-mounted contact in accordance with the present invention comprises a soldering section, a retaining section for retaining the contact in a socket base, a connecting section and a contacting section extending obliquely from the connecting section. An L-shaped portion is defined by the connecting section and the contacting section, and a guiding section is formed along an inner edge of the L-shaped portion, which defines a guiding face forming an angle with the connecting section and the contacting section. The guiding face prevents the pin of the CPU from being blocked in a corner of the L-shaped portion and increases the arm of pushing force, thereby decreasing the pushing force exerted on the pin while retaining the same normal force between the pin and the contact.

Other objects, advantages and novel features of the invention will become more apparent from the following detailed description of the present embodiment when taken in conjunction with the accompanying drawings.

DETAILED DESCRIPTION OF THE INVENTION

Figure 1:
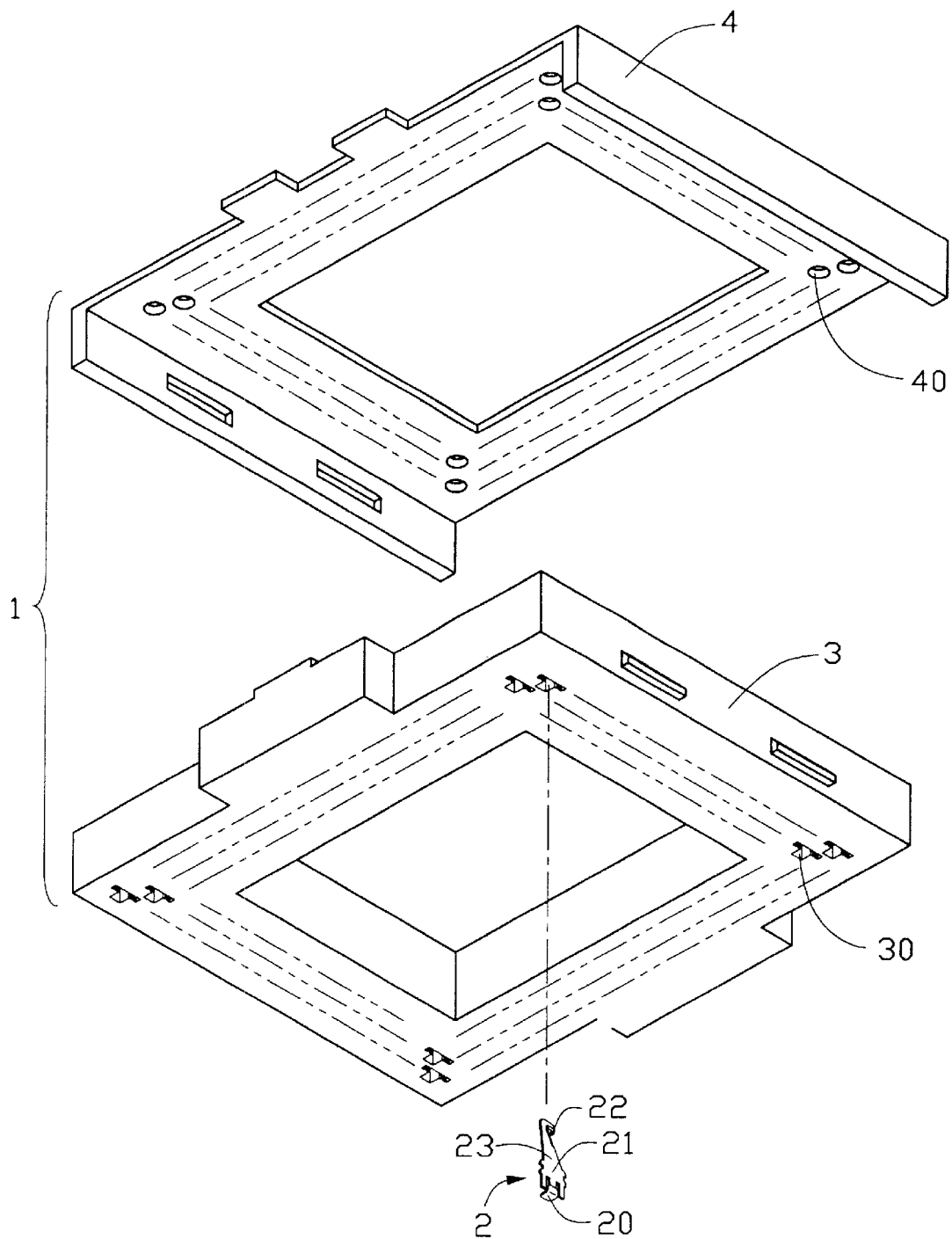
FIG. 1 is an exploded, perspective view of a ZIF socket employing a surface-mounted contact in accordance with the present invention.
Figure 2:
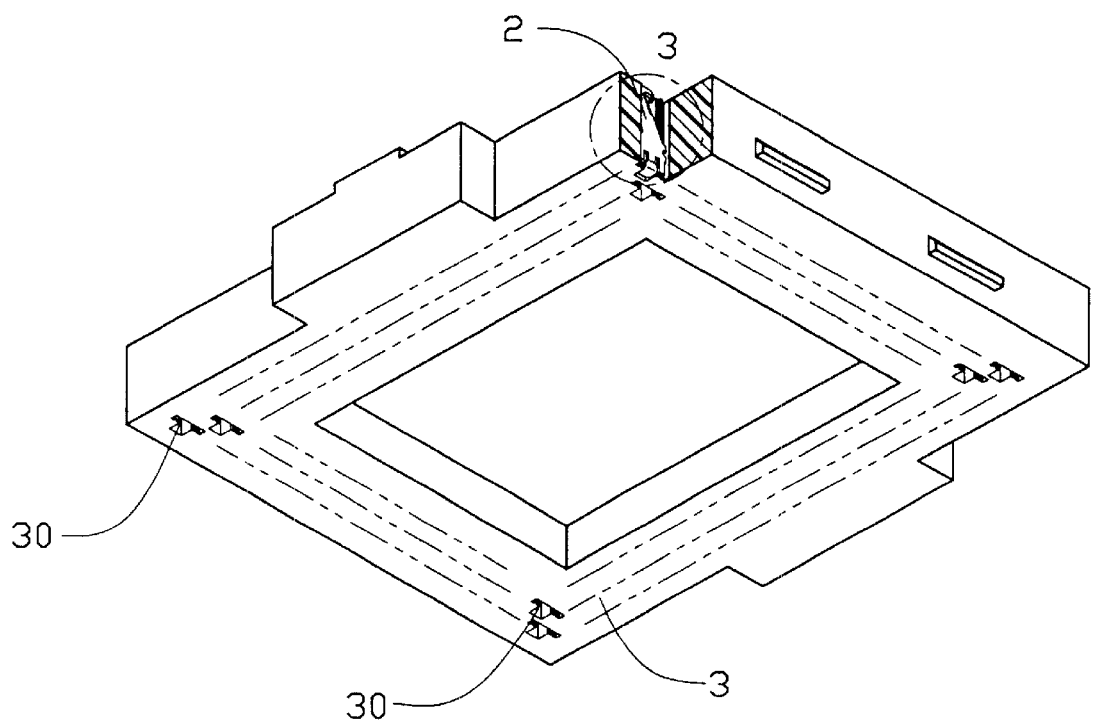
FIG. 2 is a perspective view of a dielectric base of the ZIF socket shown in FIG. 1, partially cut out to illustrate one surface-mounted contact of the present invention received in a passageway of the base.
Figure 3:
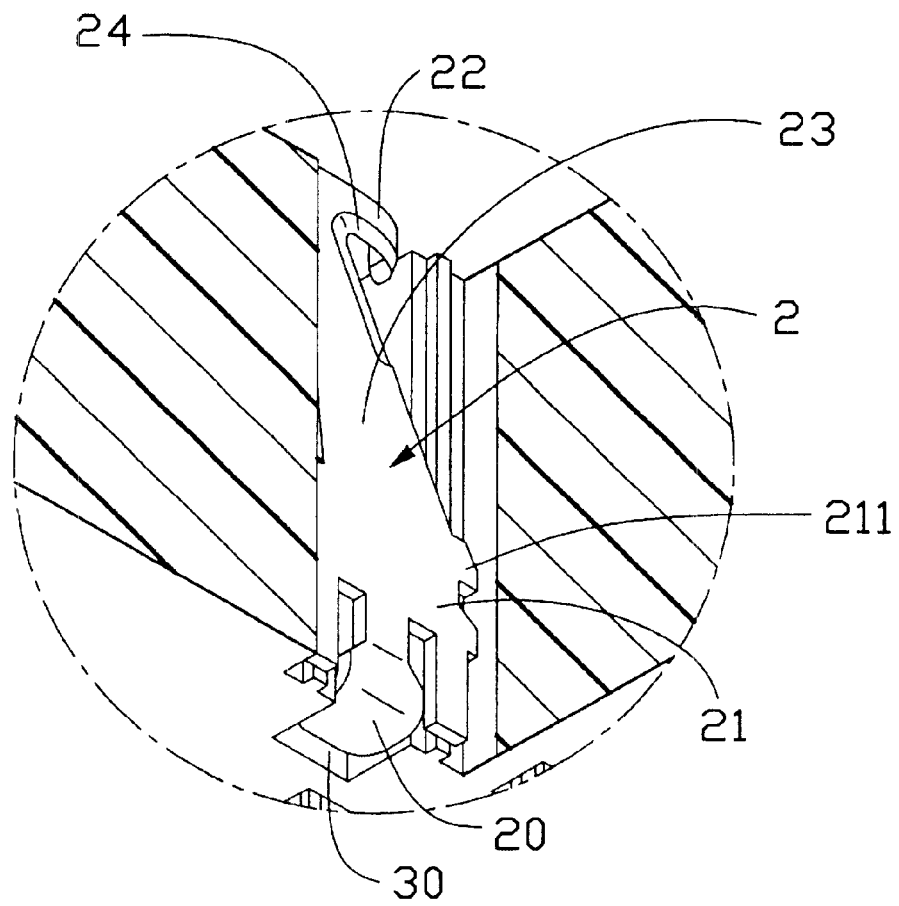
FIG. 3 is an enlarged view of a circled portion shown in FIG. 2.
Figure 4:
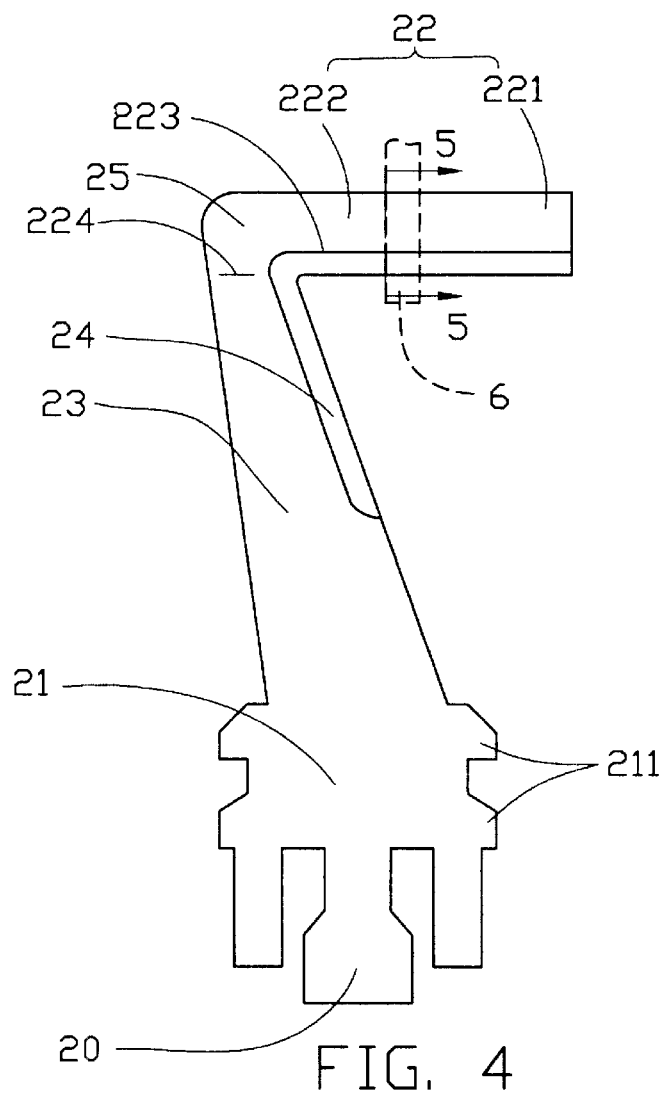
FIG. 4 is an enlarged, expanded view of the surface-mounted contact in accordance with the present invention.

Referring to FIG. 1, a ZIF socket 1 adapted for connecting a CPU (not shown) with a printed circuit board (not shown) comprises a rectangular dielectric base 3, a plurality of contacts 2 received in the dielectric base 3, and a cover 4 for being slideably mounted on the dielectric base 3. A plurality of T-shaped passageways 30 are defined in the dielectric base 3 receiving corresponding contacts 2 therein and aligned with a plurality of holes 40 defined in the cover 4 for extension of pins 6 (shown in dotted lines in FIGS. 4 and 5) of the CPU. The pins 6 of the CPU electrically contact with the respective contacts 2 of the ZIF socket 1 in corresponding T-shaped passageways 30.

As shown in FIGS. 2–5, the contacts 2 of the ZIF socket 1 each comprises a soldering section 20 configured as substantially flat plate, a retaining section 21 for securing in corresponding passageway 30, a connecting section 23, and a contacting section 22 obliquely extending from the connecting section 23.

The soldering section 20 of the contact 2 is bent vertically to the retaining sections 21 and received in a narrow part of the T-shaped passageway 30 for being soldered to the printed circuit board. A plurality of barbs 211 project from opposite edges of the retaining section 21 for interference fitting. The width of the connecting section 23 of the contact 2 regularly decreases from the retaining section 21 to the contacting section 22.

Between the contacting section 22 and the connecting section 23, a boundary 224 is formed. The contacting section 22 and the connecting section 23 together define an approximately L-shaped portion 25. A guiding section 24 with a guiding face 241 (FIG. 5) is formed along an inner edge of the L-shaped portion 25. A borderline 223 is formed between the L-shaped portion 25 and the guiding section 24. The guiding section 24 is formed by a coining process. The thickness of a part of the guiding section 24 near the borderline 223 is larger than that of a part of the guiding section 24 away from the borderline 223 so that the guiding section 24 is configured in a blade shape. Meanwhile, the whole width of the contacting section 22 and the guiding section 24 is equal to the width of the contacting section 81 of the conventional contact 8 shown in FIG. 8.

The contacting section 22 of the contact 2 comprises a base portion 222 connecting with the connecting section 23 and an arcuate portion 221 for providing resiliency when contacting with the pin of the CPU.

Figure 5:
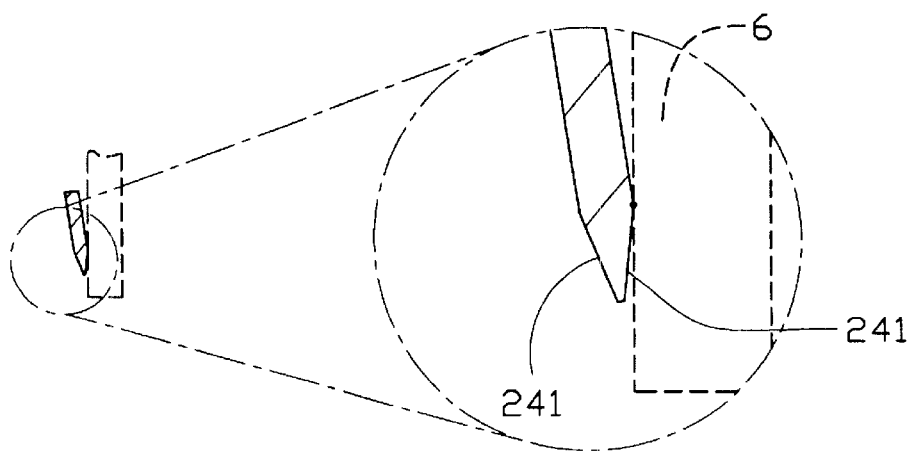
FIG. 5 is an enlarged section view of the surface-mounted contact shown in FIG. 4 taken along line 5—5.
Figure 6:
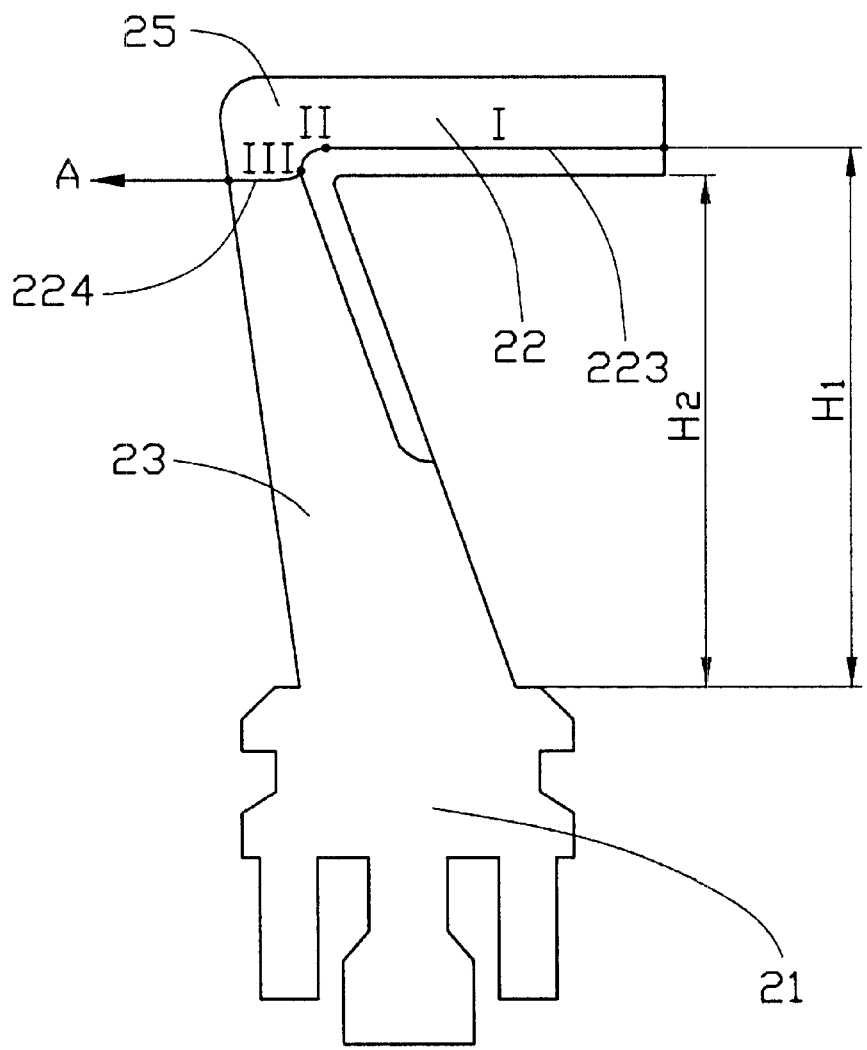
FIG. 6 is an expanded view of the surface-mounted contact, illustrating a contacting trajectory between the surface-mounted contact and a pin of a CPU.
Figure 7:
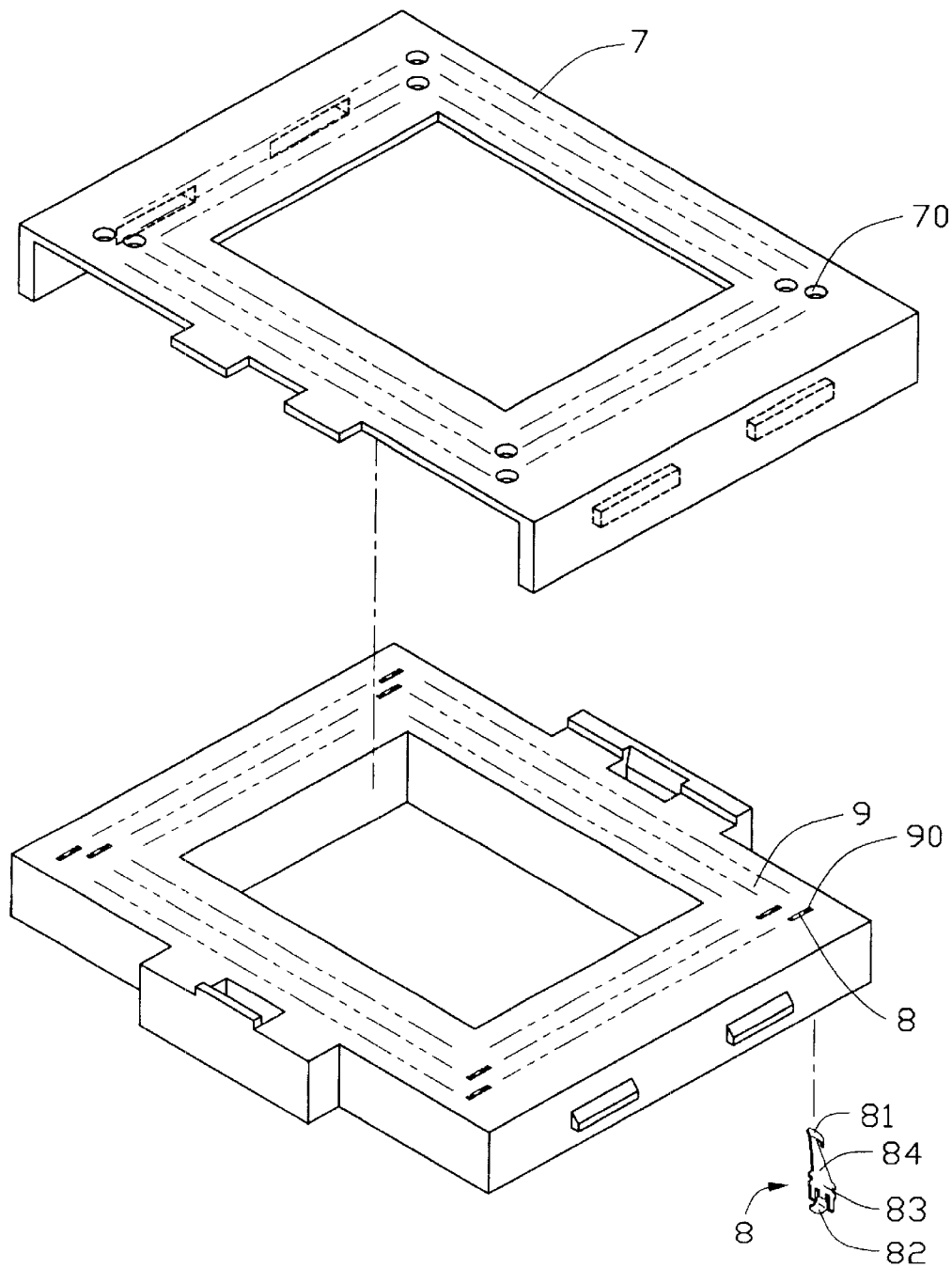
FIG. 7 is an exploded perspective view of a ZIF socket employing conventional surface-mounted contacts.
Figure 8:
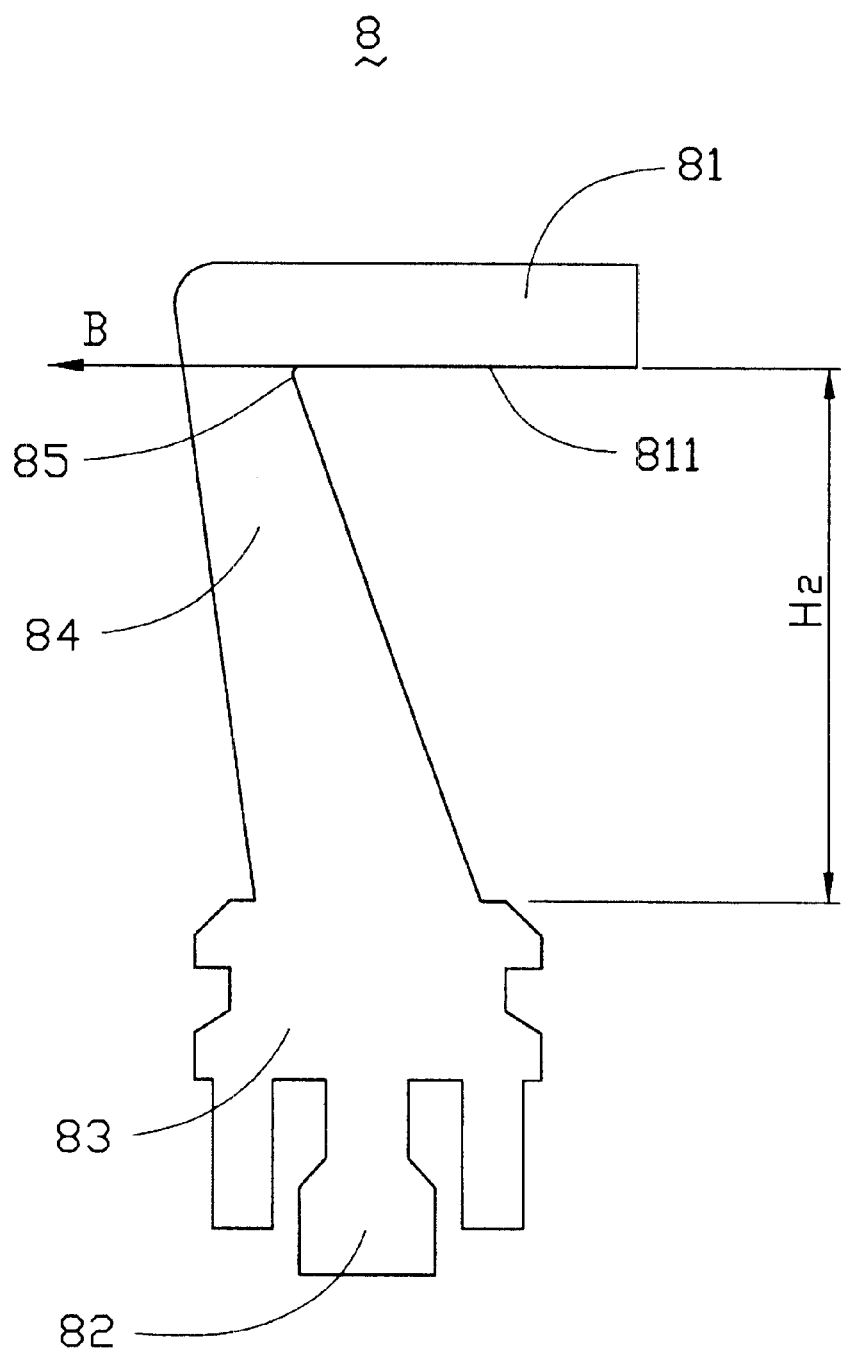
FIG. 8 is an expanded view of the conventional surface-mounted contact shown in FIG. 7.

Together referring to FIGS. 1, 2, 5 and 6, an improvement of the contact 2 in accordance with the present invention is clearly shown compared with the conventional contact 8 shown in FIG. 8. As illustrated in FIG. 6, a contacting trajectory of the pin 6 of the CPU, throughout the whole insertion process, is designated as A. The trajectory A of the pin 6 includes three parts: an initial contacting line, designated as "I", a curved contacting line, designated as "II", and a terminal contacting line, designated as "III". As shown in FIG. 8, a contacting trajectory of a pin to contact with the conventional contact 8 is designated as B, which is a substantially straight line overlapping the bottom line 811 of the contacting section 81.

When the pin 6 of the CPU is inserted in the passageway 30 of the base 3 through the hole 40 in the cover 4 and contacts with the contacting section 22 of the contact 2, the initial contacting line I overlaps a straight portion of the borderline 223 due to the provision of the inclined guiding face 241 of the guiding section 24 (FIG. 5). The arm of pushing force applied to the pin 6 is equal to a distance between the initial contacting line I and the retaining section 21, which is designated as H1 in FIG. 6. The arm of pushing force of the pin to contact with the conventional contact 8 is designated as H2 (FIG. 8). It is easy to understand that a relatively small pushing force is needed in the present invention in the same condition as the conventional socket due to H1>H2.

When the pin 6 of the CPU is further pushed to a corner of the L-shaped portion 25 of the contact 2, the guiding face 241 of the guiding section 24 leads the pin 6 to move along the arced contacting line II which overlaps a curved portion of the borderline 223 so that the pin 6 would not be blocked in the corner of the L-shaped portion 25. Sequentially, the contacting point moves from the arced contacting line II to the terminal contacting line III. The terminal contacting line III overlaps the boundary 224 which is spaced from the retaining section 21 a same distance H2 as the trajectory B from the retaining section 83. That is, when the pin 6 is pushed at a terminal position in the present invention, the arm of pushing force of the present invention and that of the conventional design are equal to each other, and the normal force between the pin and the contact is unchanged.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A surface-mounted contact comprising:

a soldering section, a retaining section upwardly extending from the soldering section, a connecting section upwardly extending from the retaining section, and a contacting section obliquely extending from the connecting section;

wherein the contacting section and the connecting section together define an approximately L-shaped portion, and the contact further comprises a guiding section coined in a blade-shape and extending along an inner edge of the L-shaped portion, the L-shaped portion and the guiding section defining an L-shaped borderline therebetween;

wherein the guiding section tapers in a direction away from the borderline and defines an oblique guiding face;

wherein the contacting section and the connecting section define a boundary therebetween, and the contacting section comprises a base portion obliquely extending from the connecting section and an arcuate portion extending from the base portion;

wherein the soldering section is configured as a flat plate and bent vertically to the retaining section;

wherein the retaining section comprises a plurality of barbs on opposite sides thereof;

wherein the connecting section tapers in a direction from the retaining section to the contacting section.

* * * * *